United States Patent [19]

Noguchi et al.

[11] Patent Number: 5,221,365
[45] Date of Patent: Jun. 22, 1993

[54] PHOTOVOLTAIC CELL AND METHOD OF MANUFACTURING POLYCRYSTALLINE SEMICONDUCTIVE FILM

[75] Inventors: Shigeru Noguchi, Hirakata; Hiroshi Iwata, Neyagawa; Keiichi Sano, Takatsuki, all of Japan

[73] Assignee: Sanyo Electric Co., Ltd., Osaka, Japan

[21] Appl. No.: 781,486

[22] Filed: Oct. 18, 1991

[30] Foreign Application Priority Data

Oct. 22, 1990 [JP] Japan .................. 2-284632
Dec. 27, 1990 [JP] Japan .................. 2-40825
Feb. 1, 1991 [JP] Japan .................. 3-12126
Mar. 20, 1991 [JP] Japan .................. 3-57186

[51] Int. Cl.⁵ .............. H01L 31/0392; H01L 31/0368; H01L 31/18
[52] U.S. Cl. .................... 136/258; 136/261; 148/DIG. 90; 148/DIG. 122; 148/DIG. 153; 257/49; 257/51; 257/75; 257/66; 257/458; 437/4; 437/109; 437/174; 437/967; 437/977; 437/248
[58] Field of Search ............ 136/258 PC, 261; 437/4, 437/109, 173–174, 233–234, 247–248, 967, 977; 357/30 K, 59 C, 59 D; 148/DIG. 48, DIG. 90, DIG. 122, DIG. 153; 257/49–51, 75

[56] References Cited

U.S. PATENT DOCUMENTS

| | | | |
|---|---|---|---|
| 4,309,225 | 1/1982 | Fan et al. | 437/5 |
| 4,406,709 | 9/1983 | Celler et al. | 437/17 |
| 4,410,471 | 10/1983 | Gurtler et al. | 264/25 |
| 4,436,557 | 3/1984 | Wood et al. | 437/2 |
| 4,539,431 | 9/1985 | Moddel et al. | 136/258 |
| 5,057,163 | 10/1991 | Barnett et al. | 136/258 |
| 5,122,223 | 6/1992 | Geis et al. | 156/603 |

FOREIGN PATENT DOCUMENTS 2-94625 4/1990 Japan .

OTHER PUBLICATIONS

A. M. Barnett et al, *Conf. Record, 20th IEEE Photovoltaic Specialists Conf.* (1988), pp. 1569–1574.
IEEE Electron Device Letters, vol. EDL-1, No. 8, pp. 159–161, "Hydrogena of Transistors Fabricated in Polycrystalline Silicon Films", Aug. 1980.
IEEE Electron Device Letters, vol. EDL-8, No. 9, pp. 425–427, "Laser-Recrystallized Polycrystalline-Silicon Thin-Film Transistors With Low Leakage Current And High Switching Ratio", Sep. 1987.

*Primary Examiner*—Aaron Weisstuch
*Attorney, Agent, or Firm*—Darby & Darby

[57] ABSTRACT

A thin film transistor and a photovoltaic cell wherein a polycrystalline semiconductive film, having a large grain size and high carrier mobility obtained by heat treatment of a polycrystalline semiconductive film, an amorphous semiconductive film, a microcrystalline semiconductive film or the like on a substrate with a textured surface, is used as a channel layer or a photoactivation layer, the textured surface being formed by etching one surface of the substrate or forming a textured thin film on the substrate.

A method of manufacturing a polycrystalline semiconductive film, wherein a surface of a substrate is etched or a textured thin film is formed on the substrate to form a textured surface, and a polycrystalline semiconductive film, an amorphous semiconductive film, a microcrystalline semiconductive film or the like is formed on the textured surface, and the semiconductive film is polycrystallized by heat treatment.

18 Claims, 15 Drawing Sheets

PHOTOVOLTAIC CELL AND METHOD OF MANUFACTURING POLYCRYSTALLINE SEMICONDUCTIVE FILM

FIELD OF THE INVENTION

This invention relates to a thin film transistor and a photovoltaic cell using polycrystalline semiconductive films as a channel layer and a photo-activation layer, respectively, and a method of manufacturing the polycrystalline semiconductor film used for them.

DESCRIPTION OF THE RELATED ART

When a thin film semiconductor is used in a transistor, a photovoltaic cell or the like, it is necessary to increase the carrier mobility in the film for improving its characteristics. In the case where a semiconductor is formed on a transparent insulative substrate made of, for example, glass or quartz which is generally used in a device like a liquid crystal display, an image sensor or the like utilizing the transistors, it is difficult to obtain a good thin film semiconductor as compared with the case of using a single crystalline semiconductive substrate.

For forming the polycrystalline semiconductive thin film, such methods as vapor phase epitaxy at atmospheric pressure, or low pressure CVD, laser annealing wherein an originally amorphous thin film semiconductor is irradiated with high energy beams such a laser beams to be transformed to a polycrystalline semiconductor, solid phase crystallization wherein an amorphous thin film semiconductor formed on a flat substrate is thermally treated at high temperatures to be transformed to a polycrystalline semiconductor [Japanese Patent Application Laid-Open No. 2-94625(1990)] are known.

Although the grain size of a polycrystalline semiconductive film obtained by solid phase crystallization is large to some degree, the size is not sufficient, nor is the carrier mobility In laser annealing, by comparison with the other methods, the thermal energy of the laser beams can be focused onto only the necessary parts, without thermally damaging the whole element. Moreover, the method is basically suitable to form the elements in a large scale device.

Laser annealing to produce a polycrystalline semiconductor is disclosed in detail in *IEEE Electron Device Lett.* Vol. EDL-1 1980, pp 159-161" and *IEEE Electron Device Lett.* Vol. EDL-8 1987, pp. 425-427".

Although the conventional laser annealing produces a polycrystalline semiconductor having a relatively large grain size and a thin film transistor utilizing the polycrystalline semiconductor material manufactured by the conventional laser annealing as a channel layer shows favorable characteristics, the characteristics do not reach those of a single crystalline semiconductor.

Further, in order to improve the photovoltaic conversion efficiency of a polycrystalline semiconductive film, it is essential to enlarge the grain size of the crystals of the polycrystalline semiconductive film and to enhance the carrier mobility in the polycrystalline semiconductive photovoltaic apparatus.

SUMMARY OF THE INVENTION

Accordingly, this invention has been devised to solve the aforementioned problems.

A first object of this invention is to provide a thin film transistor having a polycrystalline semiconductive film of large grain size and high carrier mobility as a channel layer formed by heat treatment of a p-type or n-type amorphous, polycrystalline, microcrystalline, or a mixed crystalline semiconductive film formed on a textured substrate.

A second object of this invention is to provide a photovoltaic cell having a polycrystalline semiconductive film of large grain size and high carrier mobility as a photo-activation layer formed by heat treatment of a p-type or η-type amorphous, polycrystalline, microcrystalline, or a mixed crystalline semiconductive film formed on a textured substrate.

A third object of this invention is to provide a photovoltaic cell having a polycrystalline semiconductive film of large grain size and high carrier mobility as a photo-activation layer formed by heat treatment of an intrinsic or substantially intrinsic amorphous, polycrystalline, microcrystalline, or a mixed crystalline semiconductive film formed on a textured substrate.

A fourth object of this invention is to provide a method of manufacturing a polycrystalline semiconductive film having large grain size and high carrier mobility by heat treatment of an amorphous, polycrystalline, microcrystalline, or a mixed crystalline semiconductive film formed on a textured substrate.

The above and further objects and features of the invention will more fully be apparent from the following detailed description with accompanying drawings.

DESCRIPTION OF THE PREFERRED EMBODIMENTS

The physical properties of a polycrystalline semiconductor to be used in a thin film transistor and a photovoltaic apparatus of this invention will first be described.

Figure 1:
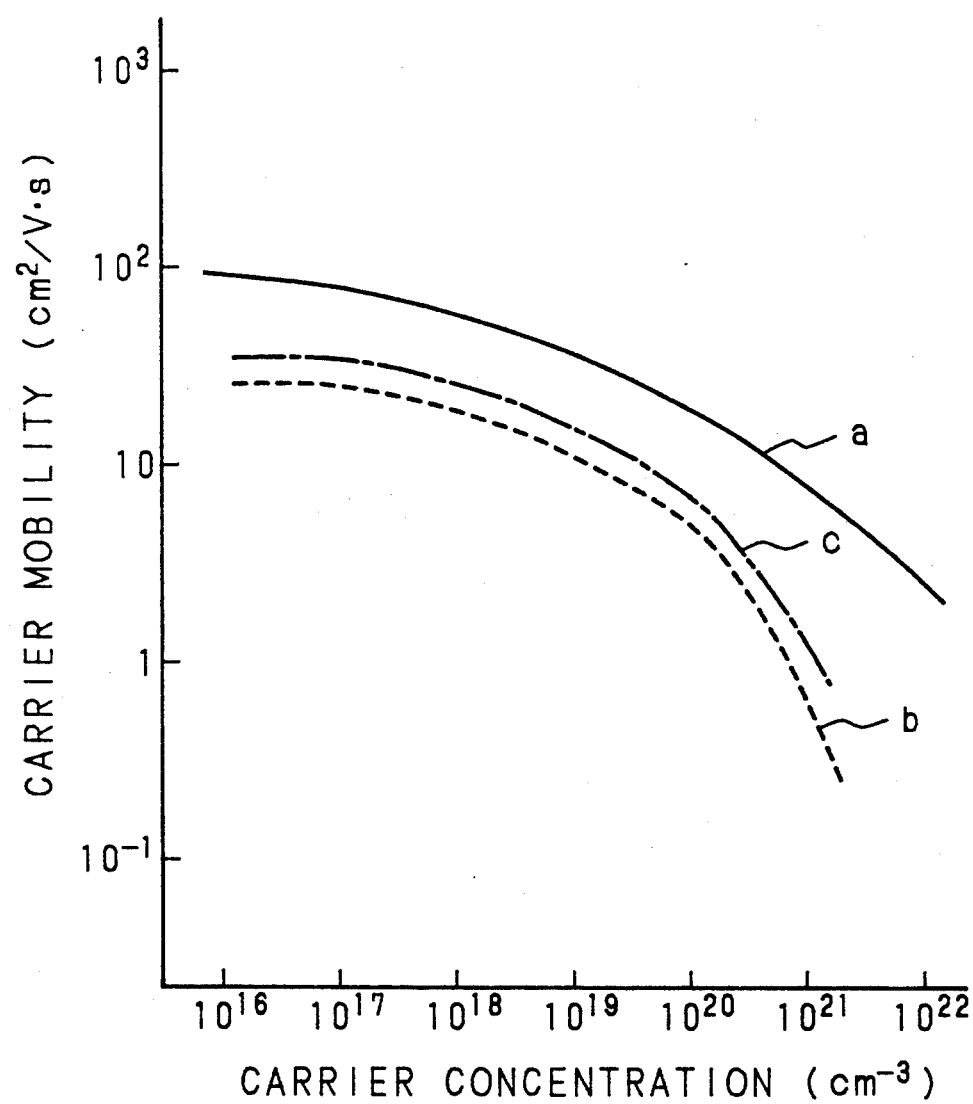
FIG. 1 is a graph showing the relation between the carrier concentration and carrier mobility of a polycrystalline semiconductive film to be used in a thin film transistor of this invention.

FIG. 1 is a graph showing the relation between the carrier concentration and the carrier mobility of an $\eta$-type polycrystalline semiconductor, curve (a), to be used in the thin film transistor of this invention and conventional polycrystalline semiconductors, curves (b) and (c), formed on a flat substrate. The carrier mobility is measured by the Hall effect.

The polycrystalline semiconductor (a) of this invention is obtained by irradiating high energy beams on an $\eta$-type amorphous silicon layer formed via plasma CVD on an insulative substrate having a textured surface with indentations of 10 $\mu$m depth. In this embodiment, an argon laser (5145 Å in wavelength) is used as a source of the high energy beams.

On the other hand, the conventional polycrystalline semiconductor (b) is obtained by irradiating the above laser beams under the same conditions as above-mentioned in an $\eta$-type amorphous silicon layer formed on a flat substrate via plasma CVD. The polycrystalline semiconductor (c) is formed in the same manner as the polycrystalline semiconductor (b) except for a 30% increase in intensity of the laser beams.

The reason why the polycrystalline semiconductor (c) is included as a sample for comparison and evaluation is based on the assumption that the amount of light permeating into the textured substrate increases because of light scattering of the high energy beams on the surface of the substrate. In other words, when the light is incident upon the textured substrate, in general, the light multiply scatters between the adjacent indentations of the textured surface, and therefore the amount of the incident light upon the substrate increases approximately by 30% as compared with the case of a flat substrate.

Therefore, in consideration of the increase in the amount of the incident light due to light scattering, the characteristics of the polycrystalline semiconductor formed on the flat substrate by increasing the intensity of the high energy beams by the above-mentioned amount was also studied.

The conditions of the plasma CVD are well known. The carrier concentration is changed by adjusting the amount of impurities doped into the amorphous silicon starting material to determine the conductivity type.

As is shown in FIG. 1, the carrier mobility of the $\eta$-type polycrystalline semiconductor (a) as compared with the conventional polycrystalline semiconductor (b) is 3 to 6 times larger. Particularly, in the range of $1 \times 10^{16}$ cm$^{-3}$ to $1 \times 10^{18}$ cm$^{-3}$ of the carrier concentration, the $\eta$-type polycrystalline semiconductor (a) shows considerably larger carrier mobility. Therefore, it is clear that the polycrystalline semiconductor formed on the textured substrate has quite favorable film quality.

Comparing the conventional polycrystalline semiconductor (c) formed with an increase in intensity of the high energy laser beams by 30% with the polycrystalline semiconductor (a) of this invention, a substantial improvement is confirmed in the polycrystalline semiconductor (a) of this invention.

This means that by the method of forming the polycrystalline semiconductor on the textured substrate with high energy laser beams, the high energy beams are not the only component of the method of heat treatment, but application of the textured substrate and the high energy laser beams greatly improves the characteristics of the polycrystalline semiconductor. The inventors of this invention presume that the great improvement in the characteristic as described above is based on the improvement of the physical properties consequent to the improvement in the mechanism of the crystallization process, but, the exact reason is not clear.

Although an $\eta$-type polycrystalline semiconductor is used in the foregoing embodiment, the same result is obtained also from a p-type polycrystalline semiconductor. As compared with the conventional p-type polycrystalline semiconductor formed on a flat substrate, the p-type polycrystalline semiconductor formed on the textured substrate exhibits 5 to 10 times larger carrier mobility.

Figure 2:
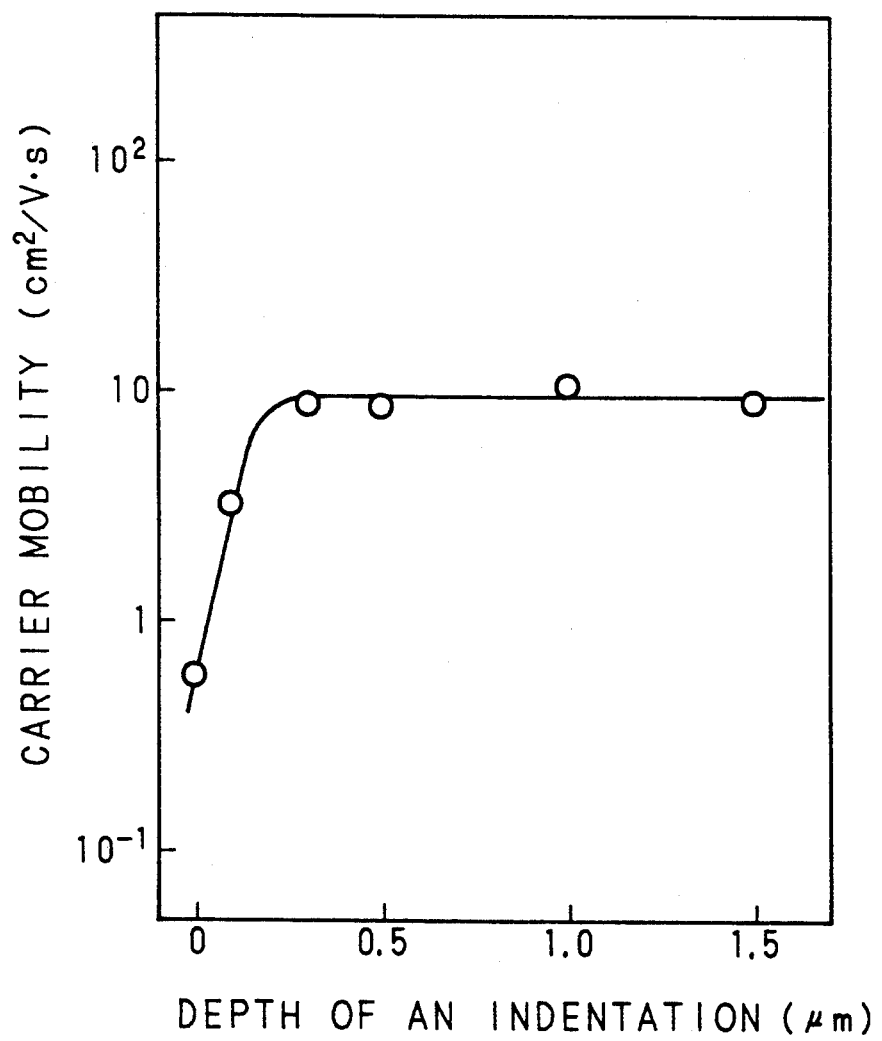
FIG. 2 is a graph showing the relation between the depth of an indentation of the textured surface and carrier mobility of a polycrystalline semiconductive film to be used in the thin film transistor of this invention.

FIG. 2 is a characteristic diagram of the relation between the depth of indentations of the textured surface and carrier mobility of the polycrystalline semiconductive film of this invention. The representative figure of a projection of the textured surface is a truncated cone or pyramid and the projections are distributed relatively thick.

A sample used in an experiment of FIG. 2 is obtained by polycrystallizing an amorphous silicon film of 3000 Å thickness, with high energy beams. As is clear from FIG. 2, up to about 0.4 $\mu$m, the deeper the depth of the indentations of the textured surface is, the higher the carrier mobility is. When the depth is 0.4 $\mu$m or more, the carrier mobility is saturated. The depth at which saturation occurs according to the thickness of the amorphous semiconductor to be polycrystallized, and generally is equal to the thickness of the amorphous semiconductor.

Figure 3:
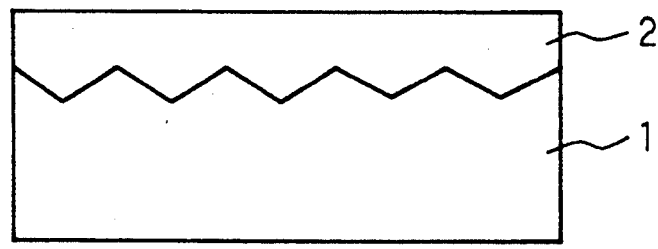
FIGS. 3, 4, and 5 are cross sectional views showing the manufacturing process of the thin film transistor of this invention.
Figure 4:
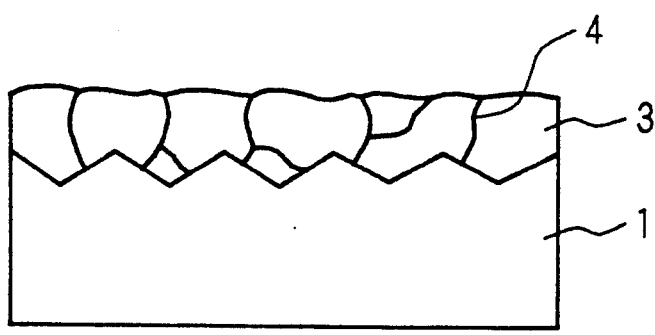
Figure 5:
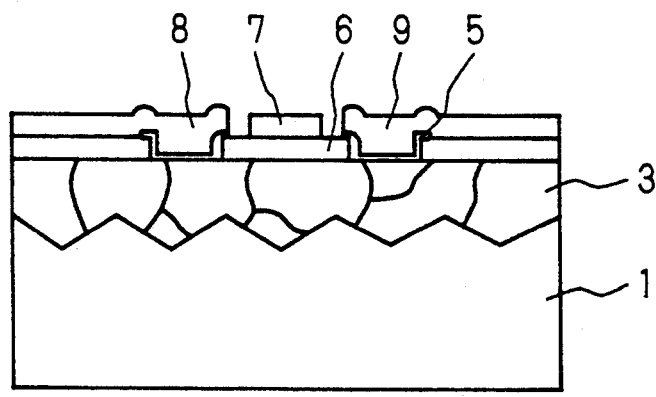

FIGS. 3 through 5 are cross sectional explanatory views of the manufacturing process of a thin film transistor of this invention. Silicon is used as a semiconductor in the first described embodiment.

In the first step shown in FIG. 3, an intrinsic amorphous semiconductor 2 which is not doped with impurities is formed on a textured substrate 1 having indentations of 0.3 $\mu$m to several tens of micrometers deep. Typically, a range of 6-10 $\mu$m can be used. An insulative substrate of glass, ceramics or the like is used for the substrate 1, while intrinsic amorphous silicon formed by a conventional plasma CVD method is used for the intrinsic amorphous semiconductor 2.

There can be used such methods of forming the textured surface as to chemically or physically etch the surface of the substrate, or to form an insulative film of $SiO_2$ or $Si_3N_4$ on the substrate and the film is formed in an island-like pattern. Either method is applicable to the substrate of the thin film transistor of this invention.

The method for forming the amorphous semiconductor 2 is not restricted to plasma CVD, but other methods such as sputtering, physical vapor deposition, or thermally assisted CVD may be employed.

The conditions of the plasma CVD are such that a silane gas of 5-50 cc/min. is used as the reaction gas, the degree of vacuum during discharging is 13.3-26.6 Pa and the RF power is 15-30 W the substrate temperature is at 200°-500° C., and film thickness is 500 Å-1μm.

In the second step shown in FIG. 4, the substrate 1 with the amorphous semiconductor 2 thereon is placed in a vacuum or an inert gas atmosphere such as nitrogen gas or the like, and irradiated from the substrate side with an Ar laser as a source of high energy beams so that the amorphous semiconductor 2 is polycrystallized.

The energy beams are not limited to the Ar laser as used above. Excimer lasers of XeCl (308 nm), KrF (248 nm) or ArF (193 nm) or electron beams may be similarly effective.

The amorphous semiconductor 2 is transformed to an intrinsic polycrystalline semiconductor 3. Reference 4 in FIG. 4 represents the grain boundary of the polycrystalline semiconductor 3.

The inventors have found it better for obtaining more stable polycrystallization to preheat the amorphous semiconductor film 2 at 500° C. for about 30 minutes prior to the irradiation of the laser beams in the second step. Since hydrogen is naturally incorporated in the amorphous semiconductor 2 from the reaction gas used in the first step, the hydrogen is largely released due to the sudden rise of temperatures due to the irradiation of the high energy beams, thereby causing roughness of the amorphous semiconductor 2.

Therefore, when the high energy beams are relatively intense or a large amount of hydrogen is contained in the amorphous semiconductor 2, when the forming temperature of the amorphous semiconductor 2 is low, the above preheat treatment is effective.

The grain size of the polycrystalline semiconductor 3 obtained in the instant embodiment is from 0.8 μm to tens of micrometers, and relatively large as compared with that of the conventional polycrystalline silicon film formed on a flat substrate, i.e., 0.1 μm-0.3 μm. The effect due to the textured substrate is not only obtained by the intrinsic amorphous semiconductor as in the instant embodiment, but is similarly obtained by the η-type or p-type amorphous semiconductor.

In the third step shown in FIG. 5, after the surface of the polycrystalline semiconductor 3 which is rendered rough by the polycrystallization is made flat through lapping or etching, an ohmic contact semiconductive film 5, an insulating gate film 6, a metallic gate film 6, a metallic drain electrode 8, and a metallic source electrode 9 are formed by well known methods, thereby completing the thin film transistor. The polycrystalline semiconductor 3 beneath the insulating gate film 6 functions as a channel layer.

Although the process of flattening the surface of the polycrystalline semiconductor is not necessarily required, the process is more favorable from the viewpoint of the stabilization of the characteristic of the element when the depth of the indentations of the textured surface is approximately the same as the length of the channel of the element.

In the instant embodiment, chromium and aluminum are used respectively for the metallic gate film and metallic source-drain films and $SiO_2$ is used for the insulating gate film.

Figure 6:
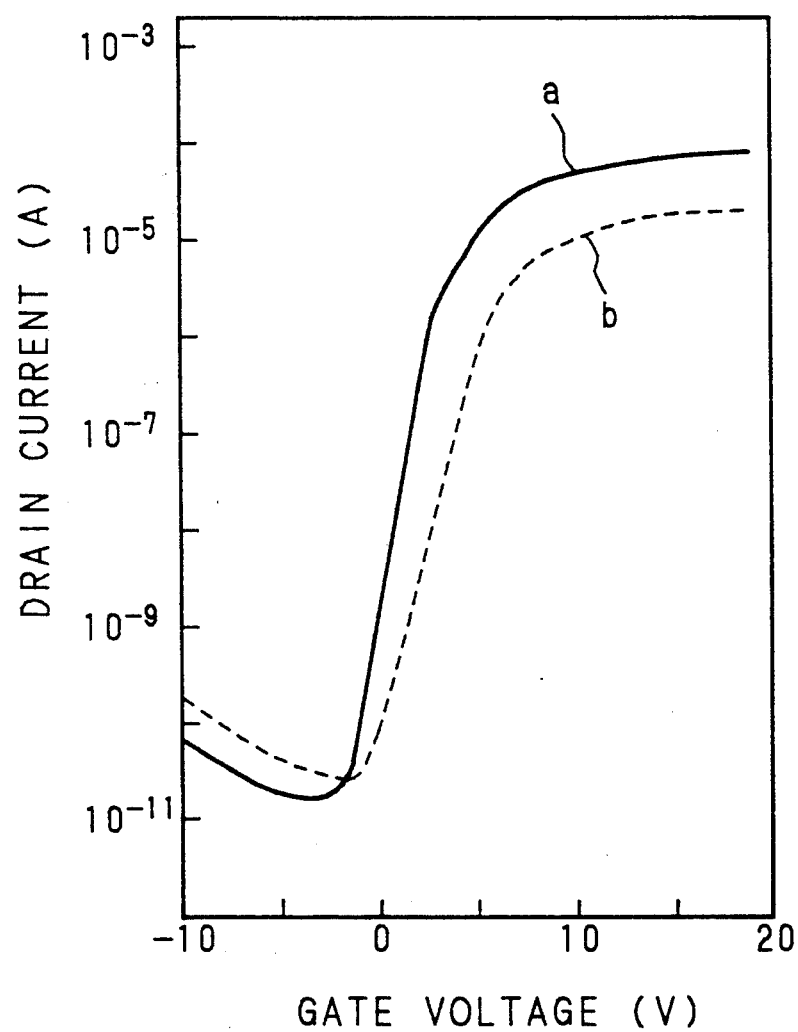
FIG. 6 is a graph showing the relation between gate voltage and drain current of the thin film transistor of this invention.

FIG. 6 is a characteristic diagram showing the relation between the drain current and gate voltage of the thin film transistor of the invention embodiment (a). For a comparison, the same relation for a conventional thin film transistor (b) using a polycrystalline semiconductor formed on a flat substrate is also indicated in FIG. 6.

As is clear from FIG. 6, the thin film transistor of the invention has a more favorable drain current characteristic with steeper rising portion than the conventional one and also has a sufficiently great ON/OFF ratio. Moreover, the carrier mobility of the thin film transistor of this invention is 100 cm$^2$/V·s, which is higher than 30 cm$^2$/V·s of the conventional transistor.

Further, although the high energy beams are irradiated from the substrate side in the foregoing embodiment, a polycrystalline semiconductor polycrystallized by high energy beams irradiated from the side of the amorphous semiconductor may be employed.

Figure 7:
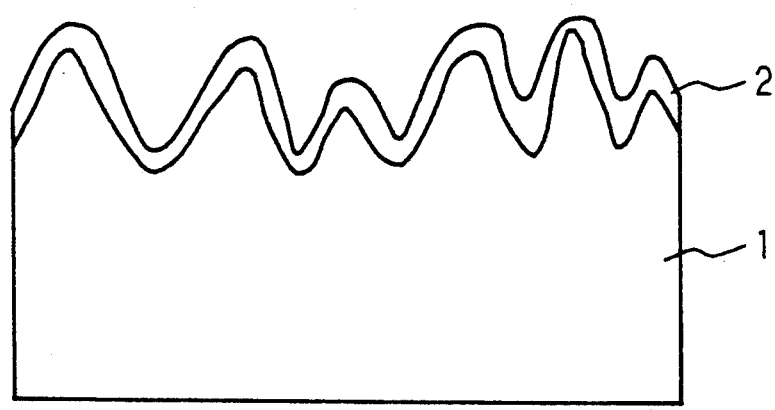
FIGS. 7 and 8 are cross sectional views showing the manufacturing process of a polycrystalline semiconductive film to be used in a photovoltaic apparatus of this invention.
Figure 8:
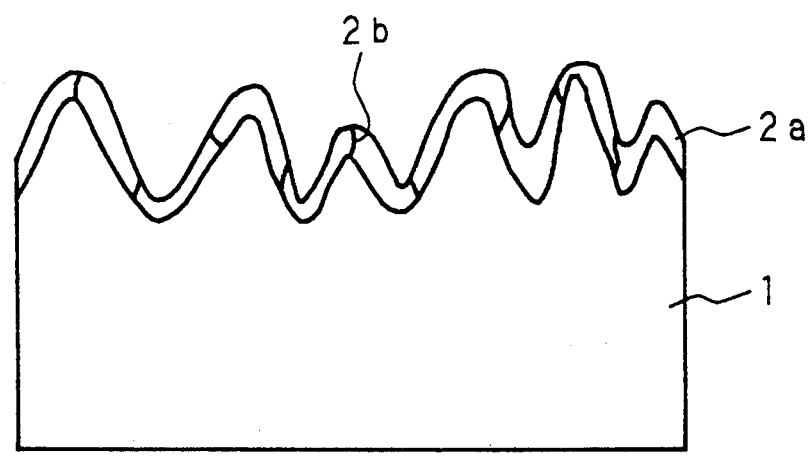

FIGS. 7 and 8 are cross sectional views showing the manufacturing process of a polycrystalline semiconductive film used in a photovoltaic cell of this invention. Silicon is used for the semiconductor.

In the first step shown in FIG. 7, a p-type amorphous silicon film 2 is formed, such as by plasma CVD, on a substrate 1 with a textured surface having indentations of 0.3 μm to several tens of micrometers deep. Again, the range of 6-10 μm is preferred. The substrate 1 may be a conductor, semiconductor, or insulator, but a transparent insulative substrate is used according to this embodiment.

There can be used such methods of forming the textured surface as to chemically or physically etch the surface of the substrate, or to form a conductive film of $SnO_2$ or ITO (Indium Tin Oxide) or an insulative film of $SiO_2$ or $Si_3N_4$ on the substrate, thereby utilizing the roughness on the surface of the film. The effect of this invention can be achieved by any of the above methods.

Particularly when using the conductive film, it is preferable to use a conductive film formed at temperatures greater than about 600° C. in order to prevent the components of the conductive film from diffusing into the semiconductive film during the heat treatment for forming the polycrystalline semiconductive film. Moreover, it is desired to achieve a grain size of the conductive film within the range of 5-50 μm. This is because if the grain size is smaller than 5 μm, the textured surface does not fully function, and if the grain size is larger than 50 μm, the polycrystalline, amorphous, or microcrystalline semiconductive film formed after the conductive film needs a considerable thickness in order to function.

In the case where a semiconductive material is employed for the substrate 1, silicon formed through plasma spraying may be used, since the surface formed through plasma spraying can be textured. For example, when using the well known low pressure plasma CVD system, the conditions to control the depth of the indentations of the textured surface should be chosen from Table below.

TABLE I

| Item | Condition |
|---|---|
| Plasma gas | Ar; 5-30 SLM, H$_2$; 5-30 SLM |
| Direct current output | 10-50 kW |
| Degree of vacuum | 1.33 × 10$^4$-5.32 × 10$^4$ Pa |
| Supply amount of powders | 1-10 g/min. |
| Substrate temperature | 500-1000° C. |
| Film thickness | 10-400 μm |

It is desired to enhance the subsequent solid phase crystallization such that the gas flow rates of Ar and hydrogen be 10 SLM, direct current output be 20-30 kW, degree of vacuum during forming be 2.66×10⁴–3.99×10⁴ Pa, amount of silicon powder supply be 3-5 g/min, substrate temperature be 500°-800° C. and the thickness of the film to be formed be 10-100 μm.

The p-type amorphous silicon film 2 may be formed by other methods such as sputtering, vapor deposition, etc. in addition to the above described plasma CVD.

The Plasma CVD requires a mixed gas of 10 cc/min. silane gas and 5 cc/min. of diborane gas (1% concentration diluted by hydrogen) for the reaction gas, with a vacuum of 10.6 Pa during discharging, RF power of 15 W, and a substrate temperature of 350° C.

In the second step shown in FIG. 8, the substrate 1 with the p-type amorphous silicon film 2 formed thereon is placed in an electric furnace to be thermally treated at 650° C. for 3-7 hours. As a result, the p-type amorphous silicon film 2 is changed to a p-type polycrystalline silicon film 2a. Reference 2b in the drawing indicates a grain boundary of the p-type polycrystalline silicon film 2a.

The grain size of the resultant p-type polycrystalline silicon film 2a according to this embodiment is up to 10 μm-20 μm, which is at least twice as large as that of the conventional polycrystalline silicon film obtained on a flat substrate through solid phase crystallization.

Moreover, from evaluation of the polycrystalline silicon film of this invention by X-ray diffraction, it is confirmed that the film has the preferred orientation, which preferred orientation is caused by the indentations of the textured substrate.

The above result cannot be obtained in conventional polycrystalline silicon films obtained via CVD or solid phase crystallization. Therefore, the polycrystalline silicon film of this invention is a film of excellent quality much closer to a single crystalline film.

The effect of the textured surface of the substrate is observed also in the case of forming an intrinsic polycrystalline silicon film or an n-type polycrystalline silicon film.

It is to be noted here that the intrinsic amorphous silicon film obtained, for example, through plasma CVD is used as an initial film to form the intrinsic polycrystalline silicon film. It is generally known that an intrinsic amorphous silicon film is slightly η-type even conductive if it is formed in a so-called nonslightly doped state. Therefore, in the case where an intrinsic polycrystalline silicon film is to be formed as the polycrystalline semiconductive film of this invention, a slightly η-type intrinsic amorphous silicon film may be used, or impurities such as boron may be lightly doped to determine the conductivity type when the intrinsic amorphous silicon film is formed, whereby the silicon film becomes substantially intrinsic.

The preferable conditions of the heat treatment of the polycrystalline semiconductive film of the invention are 500°-650° C. for 1-10 hours. The conditions for the heat treatment are determined by considering the fact that solid phase crystallization generally takes a longer time at low temperatures, and a relatively shorter time at high temperatures.

Figure 9:
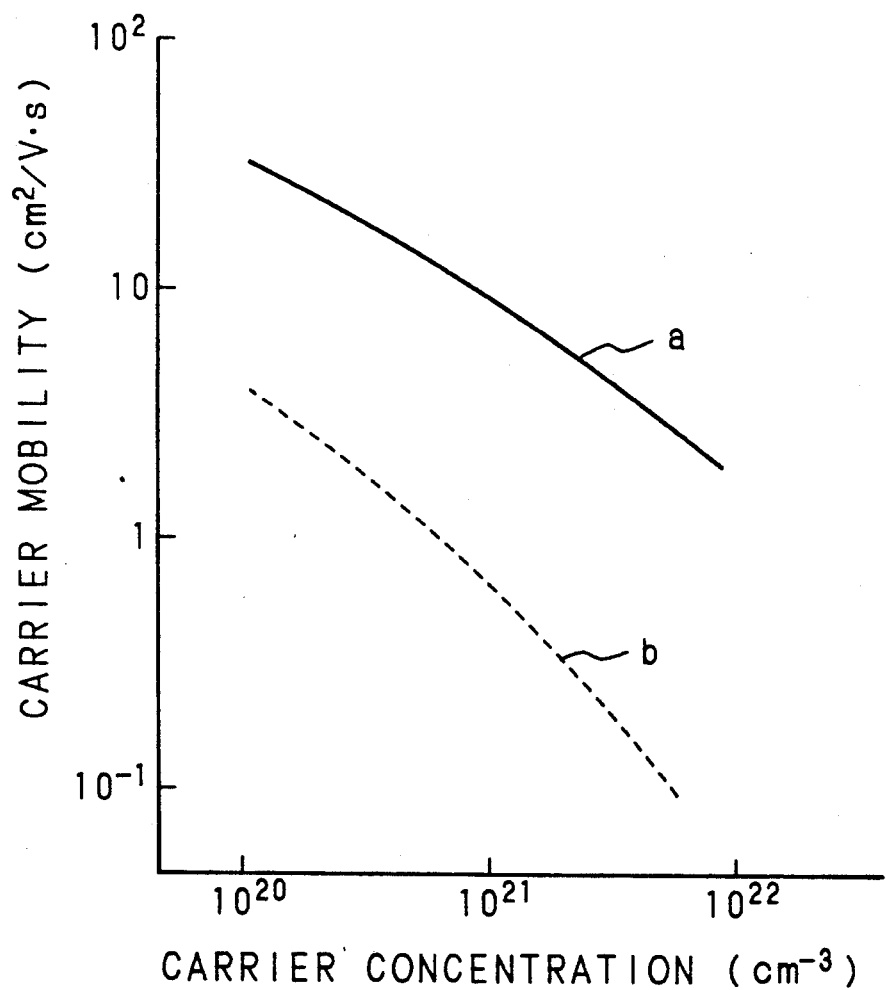
FIG. 9 is a graph showing the relation between the carrier concentration and carrier mobility of a p-type polycrystalline semiconductive film to be used in the photovoltaic cell of this invention.
Figure 10:
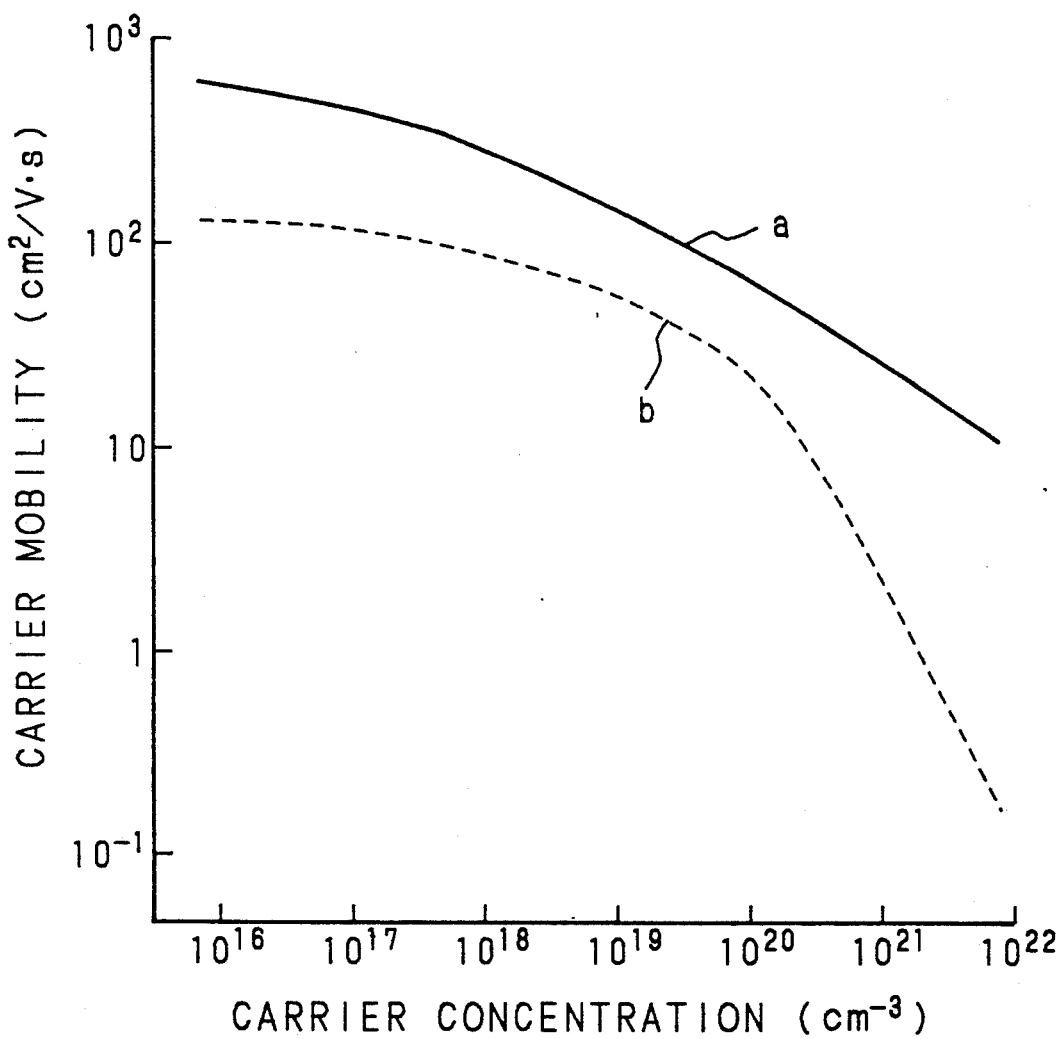
FIG. 10 is a graph showing the relation between the carrier concentration and carrier mobility of an n-type polycrystalline semiconductive film to be used in the photovoltaic apparatus of this invention.

FIGS. 9 and 10 are characteristic diagrams of the relation between the carrier concentration and carrier mobility of a polycrystalline silicon film formed on a substrate having indentations 10 μm deep according to this invention. FIG. 9 shows the relation for the p-type polycrystalline silicon film and FIG. 10 shows that of the η-type polycrystalline silicon film. A characteristic curve (b) indicated by a broken line in the drawings shows the relation of a conventional polycrystalline silicon film formed through solid phase crystallization on a flat substrate. The characteristic curve (a) shown by a solid line represents the polycrystalline silicon film of this invention.

The carrier concentration is varied by changing the amount of the dopant impurities in the conductive amorphous silicon film.

As seen from FIG. 9, the carrier mobility of the p-type polycrystalline silicon film of this invention is approximately 7–10 times higher than that of the conventional one. Also the carrier mobility of the η-type polycrystalline silicon film of this invention is approximately 3-5 times higher than that of the conventional example, as seen from FIG. 10. Especially in the range of the carrier concentration generally applicable to a photoactivation layer of a photovoltaic cell, namely, in the range of $1\times10^{17}$ cm$^{-3}$ $=1\times10^{18}$ cm$^{-3}$, considerably high carrier mobility is detected.

Figure 11:
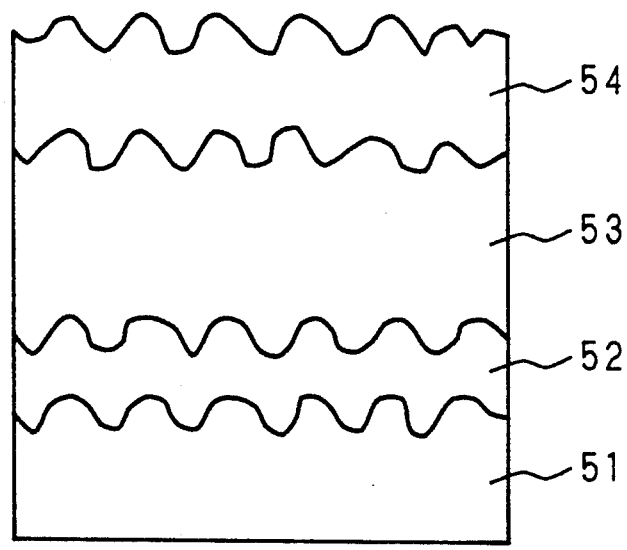
FIG. 11 is a cross sectional view of a photovoltaic cell according to a first embodiment of this invention.

Figs. 11 and 2 are cross sectional views showing the structure of photovoltaic cells according to first and second embodiments of this invention, respectively. The photovoltaic cell of the first embodiment of FIG. 11 is manufactured in the following manner.

An η-type amorphous silicon film is formed via plasma CVD on a glass substrate 51 with a textured surface having indentations 10 μm deep and then thermally treated at 500°-650° C. for 1-10 hours. Consequently, the η-type amorphous silicon film is crystallized to an η-type polycrystalline silicon film 52 with large grain size and high carrier mobility. In the embodiment, the sheet resistance of the η-type polycrystalline silicon film 52 is controlled to be 10Ω/□ by adjusting the amount of dopant impurities in the η-type amorphous silicon film.

Subsequently, an η-type amorphous silicon film lightly doped with phosphorous is formed on the surface of the η-type polycrystalline silicon film 52 via plasma CVD, and thermally treated under the conditions as described above. Accordingly, the η-type amorphous silicon film is changed through solid phase crystallization to an η-type polycrystalline silicon film 53 serving as a photo-activation layer.

The carrier concentration of the η-type polycrystalline silicon film 53 is $1\times10^{17}$–$1\times10^{18}$ cm$^{-3}$ and the carrier mobility is 300–500 cm²/V·s.

The effect of the textured surface of the substrate 51 is also observed in the solid phase crystallization of the η-type polycrystalline silicon film 53. In other words, since the thickness of the η-type polycrystalline silicon film 52 formed prior to the η-type polycrystalline silicon film 53 is only 0.1 μm although the indentations of the textured surface is 10 μm deep, the shape of the textured surface of the substrate 51 appears on the surface of the η-type polycrystalline silicon film 52 even when the η-type polycrystalline silicon film 52 is formed on the substrate 51. Therefore, the textured surface of the substrate is effective during solid phase crystallization of the η-type polycrystalline silicon film 53 as well.

The effect of the textured surface of the substrate varies depending on the thickness of the film formed on the substrate. When the effect is desired in a thick film, the indentations of the textured surface should be deeper.

After a p-type amorphous silicon film is formed on the η-type polycrystalline silicon film 53 via plasma CVD, heat treatment is carried out to form a p-type polycrystalline silicon film 54 by solid phase crystallization. In this case, the total thickness of the η-type polycrystalline silicon film 52 and η-type polycrystalline silicon film 53 formed prior to the p-type polycrystalline silicon film 54 is larger in comparison with the depth of the indentations of the textured surface, and therefore the effect due to the textured surface becomes smaller during the formation of the p-type polycrystalline silicon film 54 than when the η-type polycrystalline silicon film 53 is formed.

In a conventional photovoltaic cell, a metallic electrode is formed on one side of the laminated p-type semiconductor and η-type semiconductor with a transparent conductive film formed on the other side thereof. According to the instant embodiment, however, since the sheet resistance of the p-type polycrystalline silicon film 54 is as low as 10Ω/□ or less, a transparent conductive film is not provided thereabove. But a transparent conductive film may, if desired, be formed on the p-type polycrystalline silicon film 54.

Figure 12:
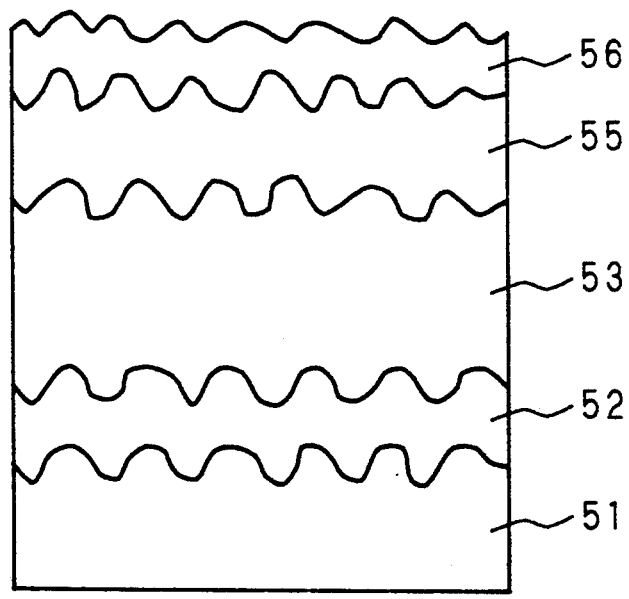
FIG. 12 is a cross sectional view of a photovoltaic cell according to a second embodiment of this invention.

In comparison with the photovoltaic cell of the first embodiment, the photovoltaic cell of the second embodiment shown in FIG. 12 uses a p-type amorphous silicon film 55 in place of the p-type polycrystalline silicon film 54. At the same time, the second embodiment is different in that a transparent conductive film 56 is provided as a window material for the light to enter. That is, the P-type Polycrystalline silicon film 54 in the first embodiment not only generates an internal field of the photovoltaic cell, but also acts as an electrode like the above-described transparent conductive film to generate carriers. The η-type polycrystalline silicon film 52 of Figs. 11 and 12 is provided with this function.

The heat treatment is performed each time a film is formed through solid phase crystallization in the photovoltaic cells of the first and second embodiments. Therefore, a different polycrystalline silicon film may have already been grown via solid phase crystallization immediately beneath the film now being formed. In such a case as above, although polycrystallization of the latter film is accelerated by the preformed film, the degree of acceleration is rather small in contrast with the effect of the textured surface.

Figure 13:
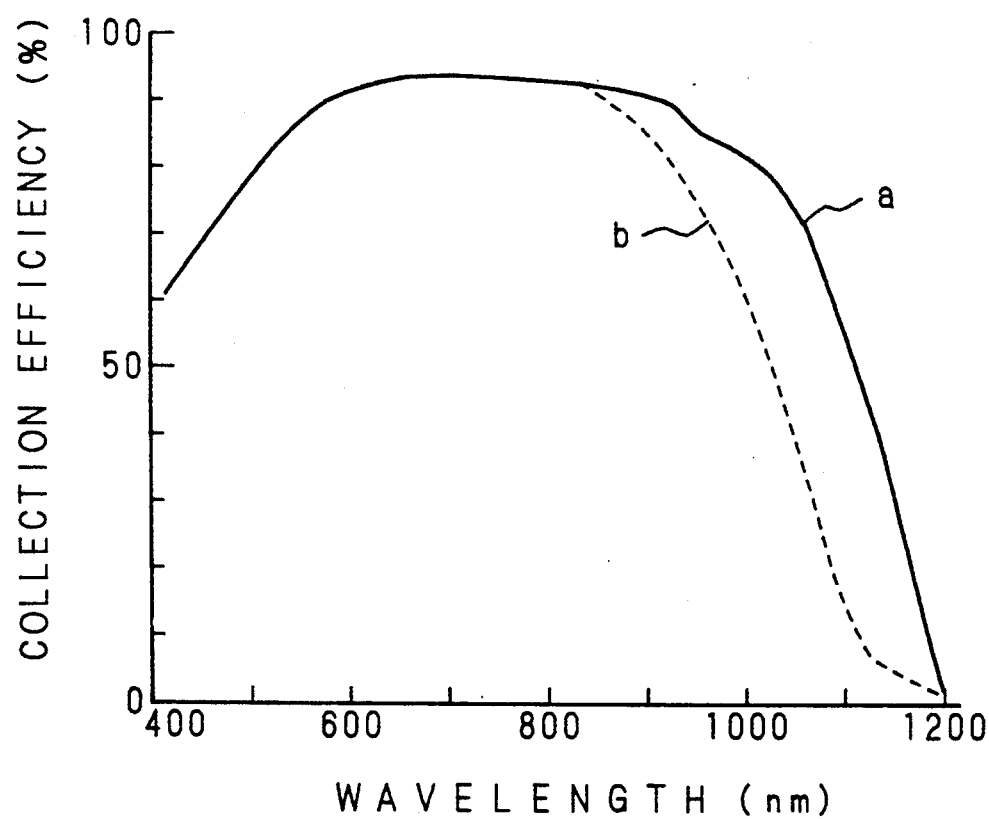
FIG. 13 is a characteristic diagram of the collection efficiency of the photovoltaic cell vs. wavelength according to the first embodiment of this invention.

FIG. 13 is a characteristic diagram of the collection efficiency of the photovoltaic cell of the first embodiment. A characteristic curve (b) of a conventional photovoltaic cell formed on a flat substrate is also indicated for comparison with a characteristic curve (a) of this invention. The light is incident upon the photovoltaic cell from the side where the film is formed.

In FIG. 13, the collection efficiency of the photovoltaic cell of this invention is seen as greatly improved in the long wavelength region as compared with that of the conventional photovoltaic cell. While the conventional cell shows 9% photoelectric conversion efficiency, the photovoltaic cell of this invention has 11% efficiency.

Although the above improvement of the characteristic is considered attributable to the substantial light-path length lengthening by the multiple light scattering of the incident light into the polycrystalline silicon film due to the textured surface of the substrate, such a large improvement by the above-mentioned effect is never achieved only by the light scattering.

Figure 14:
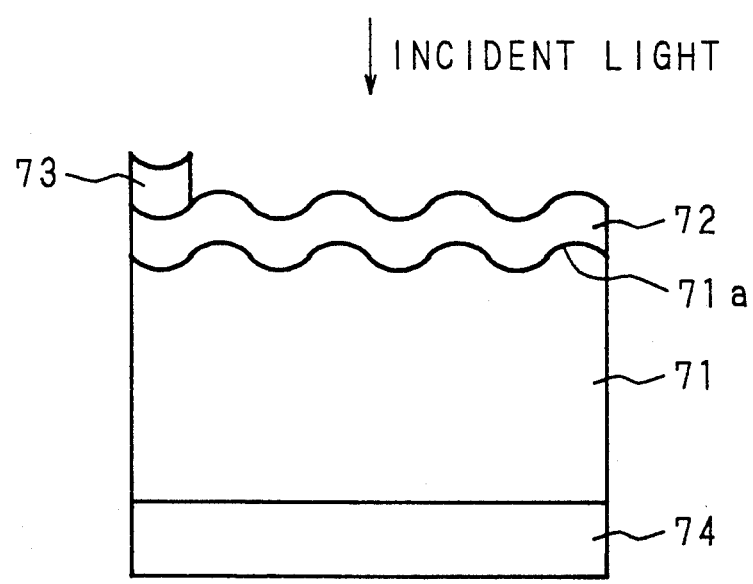
FIG. 14 is a cross sectional view of a photovoltaic cell according to a third embodiment of this invention.

A photovoltaic cell according to a third embodiment of this invention will now be discussed. FIG. 14 is a cross sectional view showing the structure of a photovoltaic cell which employs single crystalline silicon as a substrate. Referring to FIG. 14, one surface 71a of an η-type single crystalline silicon substrate 71 is chemically texture etched. A p-type polycrystalline semiconductive film 72 is obtained via heat treatment and solid phase crystallization of an initially p-type amorphous silicon film. Metallic electrodes 73 and 74 are formed of chromium, aluminum, etc. According to the present embodiment, the substrate 71 serves also as the semiconductive material of one conductivity type of the photovoltaic cell.

The p-type amorphous silicon film is formed by the well known plasma CVD. The carrier concentration after polycrystallization of the film is $5 \times 10^{20}$ cm$^{-3}$.

An etchant mainly composed of sodium hydroxide is used to form the textured surface. The depth of the indentations of the textured surface is in the range of several micrometers to 10 μm.

Figure 15:
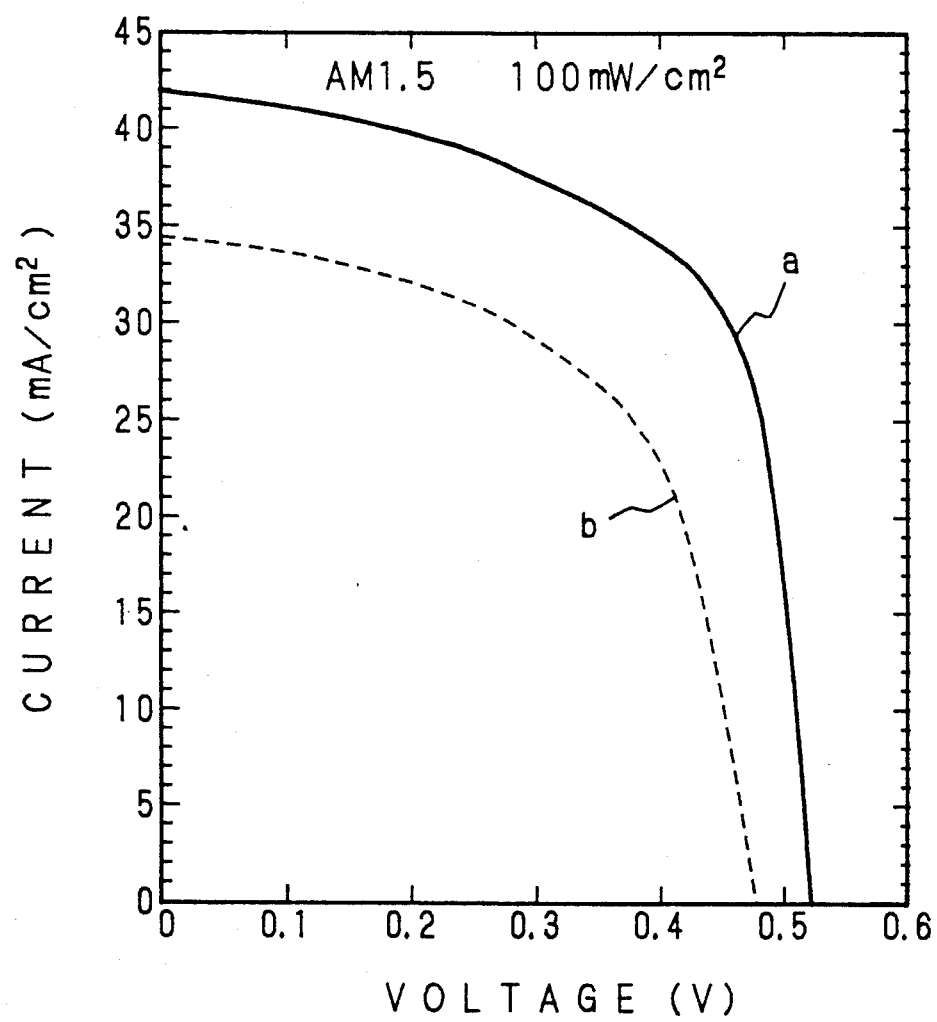
FIG. 15 is a graph showing the voltage-current characteristic of the photovoltaic cell according to the third embodiment.

In FIG. 15, the voltage-current characteristic of the photovoltaic cell (a) of the third embodiment and a comparative photovoltaic cell (b) using a single crystalline silicon substrate without a textured surface are shown.

It is clear from FIG. 15 that the photovoltaic characteristic is considerably improved by the textured surface of the substrate.

The inventors of this invention have made certain that a polycrystalline semiconductive film with larger grain size can be obtained by forming an insulative film on the amorphous semiconductive film formed on the textured substrate before heat treatment, as compared with the case without the insulative film.

This is because the insulative film suppresses the polycrystallization of the amorphous semiconductive film from the side of the insulative film.

Although the amorphous semiconductive film is used as the initial film for solid phase crystallization in the foregoing embodiments, the effect of this invention is not limited to this, but the polycrystalline semiconductive film of this invention can be obtained from a microcrystalline semiconductive film having a different crystal structure, or from a mixed crystalline semiconductive film of a microcrystalline semiconductor and an amorphous semiconductor.

Furthermore, the polycrystalline semiconductive film is not restricted to silicon as above, but may be germanium.

The heat treatment for polycrystallization is not restricted to solid phase crystallization but may be laser annealing.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A photovoltaic cell for generating electromotive force from light incident in the vicinity of the junction between two semiconductor layers having opposite conductivity types, comprising:
    a substrate having a textured surface with the depth of the texture being in the range of from about 0.3 to about 10 μm;

a first polycrystalline semiconductive layer obtained by heat treatment at a temperature in the range of from about 500° C. to about 650° C. of a semiconductive film of one conductivity type selected from the group consisting of amorphous, polycrystalline, microcrystalline, and their mixed crystalline semiconductive films formed on said textured surface;

a photo-activation layer of a polycrystalline semiconductive film obtained by heat treatment of a semiconductive film of the one conductivity type selected from the group consisting of amorphous, polycrystalline, microcrystalline, and their mixed crystalline semiconductive films formed on said first polycrystalline semiconductive layer; and a second polycrystalline semiconductive layer obtained by heat treatment of a semiconductive film of opposite conductivity type selected from the group consisting of amorphous, polycrystalline, microcrystalline, and their mixed crystalline semiconductive films formed on said photo-activation layer.

2. A photovoltaic cell for generating electromotive force from light incident in the vicinity of the junction between two semiconductor layers having different conductivity types, comprising:

a substrate having a textured surface with the depth of the texture being in the range of from about 0.3 to about 10 μm;

a first polycrystalline semiconductive layer obtained by heat treatment at a temperature in the range of from about 500° C. to about 650° C. of a semiconductive film of one conductivity type selected from the group consisting of amorphous, polycrystalline, microcrystalline, and their mixed crystalline semiconductive films formed on said textured surface;

a photo-activation layer of a polycrystalline semiconductive film obtained by heat treatment of a semiconductive film of said one conductivity type selected from the group consisting of amorphous, polycrystalline, microcrystalline, and their mixed crystalline semiconductive films formed on said first semiconductive layer; and a second semiconductive layer of an amorphous semiconductive film having the opposite conductivity type formed on said photo-activation layer.

3. A photovoltaic cell for generating electromotive force from light incident in the vicinity of the junction between two semiconductors of opposite conductivity types, comprising:

a single crystalline semiconductive substrate of one conductivity type having a textured surface with the depth of the texture being in the range of from about 0.3 to about 10 μm; and a polycrystalline semiconductive layer obtained by heat treatment at a temperature in the range of from about 500° C. to about 650° C. of a semiconductive film of the opposite conductivity type selected from the group consisting of amorphous, polycrystalline, microcrystalline, and their mixed crystalline semiconductive films formed on said textured surface.

4. A photovoltaic cell for generating electromotive force from light incident in the vicinity of a semiconductor layer between two semiconductors of opposite conductivity types, comprising:

a substrate having a textured surface with the depth of the texture being in the range of from about 0.3 to about 10 μm;

a first polycrystalline semiconductive layer obtained by heat treatment at a temperature in the range of from about 500° C. to about 650° C. of a semiconductive film of one conductivity type selected from the group consisting of amorphous, polycrystalline, microcrystalline, and their mixed crystalline semiconductive films formed on said textured surface;

a photo-activation layer of a polycrystalline semiconductive film obtained by heat treatment of an intrinsic or substantially intrinsic semiconductive film selected from the group consisting of amorphous, polycrystalline, microcrystalline, and their mixed crystalline semiconductive films formed on said first polycrystalline semiconductive layer; and a second polycrystalline semiconductive layer obtained by heat treatment of a non-single crystalline film of the opposite conductivity type selected from the group consisting of amorphous, polycrystalline, microcrystalline, and their mixed crystalline semiconductive films formed on said photo-activation layer.

5. A method of manufacturing a polycrystalline semiconductive film, comprising the steps of:

forming a textured surface on a substrate with the depth of the texture being in the range of from about 0.3 to about 10 μm;

forming a semiconductive film selected from the group consisting of amorphous, polycrystalline, microcrystalline, and their mixed crystalline semiconductive films on said textured surface; and polycrystallizing said semiconductive film via heat treatment at a temperature in the range of from about 500° C. to about 640° C.

6. A method of manufacturing a polycrystalline semiconductive film according to claim 5, wherein the depth of indentation of said textured surface is approximately equal to the thickness of said semiconductive film to be polycrystallized.

7. A method of manufacturing a polycrystalline semiconductive film according to claim 5, wherein the depth of indentation of said textured surface is in the range of from about 0.3 μm to about several tens of micrometers.

8. A method of manufacturing a polycrystalline semiconductive film according to claim 5, wherein said textured surface is formed by etching the substrate.

9. A method of manufacturing a polycrystalline semiconductive film according to claim 8, wherein the depth of indentation of said textured surface is in the range from about 0.3 μm to about several tens of micrometers.

10. A method of manufacturing a polycrystalline semiconductive film according to claim 5, wherein said textured surface is formed by forming the substrate through plasma spraying of semiconductive material.

11. A method of manufacturing a polycrystalline semiconductive film according to claim 10, wherein the depth of indentation of said textured surface is 6–10 μm.

12. A method of manufacturing a polycrystalline semiconductive film according to claim 5, wherein said textured surface is formed by a conductive film formed on said substrate.

13. A method of manufacturing a polycrystalline semiconductive film according to claim 12, wherein said conductive film is formed at temperature of approximately 600° C.

14. A method of manufacturing a polycrystalline semiconductive film according to claim 12, wherein the grain size of said conductive film is 5–50 μm.

15. A method of manufacturing a polycrystalline semiconductive film according to claim 5, wherein said textured surface is formed by an insulative film formed on said substrate.

16. A method of manufacturing a polycrystalline semiconductive film according to claim 5, further comprising the step of:

forming an insulative film on said semiconductive film before the polycrystallizing step.

17. A method of manufacturing a polycrystalline semiconductive film according to claim 5, further comprising the step of:

preheating said semiconductive film at a temperature lower than that used in the heat treatment of said polycrystallization step.

18. A method of manufacturing a polycrystalline semiconductive film according to claim 17, wherein the conditions of the heat treatment in said preheating step is at 500° C. for approximately 30 minutes.

* * * * *